ZIRCONIUM MASK FOR SEMICONDUCTOR FABRICATED
USING ALKALINE ETCHANTS
Filed May 8, 1970

INVENTOR
W. C. ERDMAN
BY H. W. Lockhart
ATTORNEY

United States Patent Office 3,674,580

Patented July 4, 1972

3,674,580

ZIRCONIUM MASK FOR SEMICONDUCTOR FABRICATED USING ALKALINE ETCHANTS

William Charles Erdman, Bethlehem, Pa., assignor to Bell Telephone Laboratories, Incorporated, Murray Hill, N.J.

Filed May 8, 1970, Ser. No. 35,746
Int. Cl. C23f *1/04*
U.S. Cl. 156—13 4 Claims

ABSTRACT OF THE DISCLOSURE

A mask comprising a thin film of zirconium metal is applied directly to a semiconductor surface for use with strong alkaline etchants, such as potassium hydroxide, of the type used for antisotropic etching. Typically, a zirconium film of several hundred angstrons thickness is applied using high energy means including sputtering and an electron gun.

BACKGROUND OF THE INVENTION

The anisotropic etching of semiconductor device material involves the use of strong alkaline etchants, for example, a hot aqueous solution of patassium hydroxide. This technique, as disclosed in the application of R. C. Kragness and H. A. Waggener, Ser. No. 603,292, filed Dec. 26, 1966 now abandoned, and assigned to the same assignee as this application, constitutes a most advantageous procedure for precisely shaping semiconductor bodies for a variety of purposes. In the foregoing noted application selective etching with alkaline etchants is disclosed using mask patterns formed of silicon dioxide. Typically, the silicon dioxide films for such masking purposes are applied in two steps involving an initial anodic oxidation for improved adherence followed by a sputtering process for applying a further thickness of silicon dioxide. The mask pattern then is formed by photoresist masking and hydrofluoric acid etching steps.

Although the foregoing described technique is satisfactory, it does include the complication of a two step application of the masking material, and furthermore, the silicon dioxide is not completely impervious to the hot alkaline etchants used. Over the periods of time, typically an hour or more, required for some fabrication processes, there is a considerable erosion of the silicon dioxide mask with consequent loss of mask resolution. Accordingly, a mask material which may be applied simply and having a higher degree of resistance against the alkaline etchants is desired.

SUMMARY OF THE INVENTION

In accordance with this invention there is applied to a semiconductor surface by high energy beam means a thin film of zirconium metal. It is important, as is the case in all semiconductor processing, to thoroughly clean the surface before application of the zirconium film. After the application of the metal film, which may range in thickness from several hundred angstroms to several thousand, the mask pattern is formed in the zirconium film by conventional photoresist masking and acid etching processes.

The thus formed zircosium mask has an extremely high degree of adherence to the semiconductor material and is virtually impervious to the hot alkaline etchants used for anisotropic etching. Such etchants are typically hot aqueous solutions of the hydroxides of potassium, sodium, lithium, cesium or rubidium. However, when applied as a thin film of from 100 to about 300 A. thickness the zirconium film is sufficiently transparent to permit the use of infrared techniques for optical alignment of the mask pattern and films of this thickness are entirely satisfactory for alkaline etching processes of one hour or more in length. Thus, a most advantageous single step application technique for an etch resistant mask with alkaline etchants is disclosed.

BRIEF DESCRIPTION OF THE DRAWING

The drawing shows a series of cross section views illustrating the succession of steps in the application of the zirconium mask to the semiconductor surface.

DETAILED DESCRIPTION

Figure 1A:
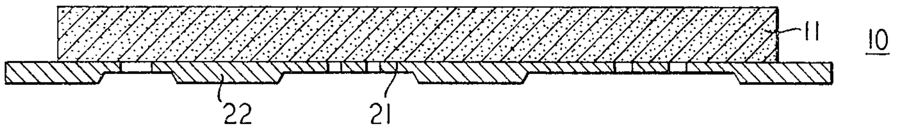

Referring to the drawing, FIG. 1A shows, in cross section, a semiconductor slice 10 which is to be formed into several air-isolated wafers using anisotropic etching. The slice 10, at this point, has been processed to form therein an integrated circuit and the active surface 21 has thereon a metallization pattern 22 providing interconnections and beam leads, generally as disclosed in M. P. Lepselter Pat. 3,335,338. The surface 11, from which the etching is to proceed, is carefully cleaned so as to procedure an uncontaminated surface which may, advantageously, be covered with an inherently-formed extremely thin oxide film in the case of silicon semiconductor material. A typical cleaning process may include an initial degreasing step involving boiling in trichloroethylene, followed by boiling in acetone and rinsing in pure water. A further important cleaning step may be an ultrasonic cleaning in a suitable detergent solution and finally, boiling in a 50 percent hydrogen peroxide solution. The purpose of careful cleaning is to enhance the adherence of the metal film which is to be deposited in the next succeeding step in accordance with the invention.

Figure 1B:
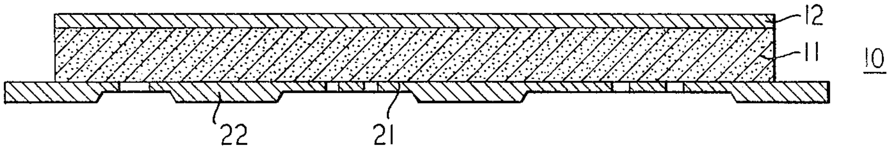

In FIG. 1B the semiconductor slice 10 has formed over the surface 11 a film of zirconium metal 12 having a thickness advantageously of the order of 100 to 300 A. Films having a thickness of up to several thousand angstroms are useful; however, such films tend to be opaque to infrared radiation when the thickness is over about 400 to 500 A. and, therefore, do not permit optical alignment of the mask patterns used for photoresist delineation. Typically, the zirconium film is applied using a high energy means such as radio-frequency sputtering or an electron gun in order to enhance adherence to the semiconductor surface. In one embodiment using R.F. sputtering, 100 A. per minute was deposited at 4 to 5 thousand volts with peak power from 6 to 8 hundred watts using a 4 to 5 innch target. In another typical embodiment a 200 A. thick zirconium film was applied using an E-gun at 4 kilovolts and 500 mmilliamperes in a period of 4 minutes.

Figure 1C:
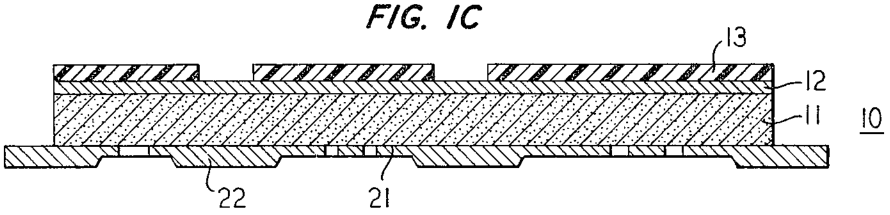

In FIG. 1C a photoresist pattern is formed on the surface of the zirconium film 12 by standard techniques. Typically, a thin film 13 of photosensitive material, such as KPR, a trademark product of Kodak Corporation, Rochester, N.Y., is applied over the entire metal surface and a photographic development process delineates a pattern in the photoresist layer. The exposed zirconium areas then are removed using a relatively mild acid etchant composed, for example, of an aqueous solution of 2 percent hydrofluoric acid and 1 percent nitric acid.

Figure 1D:
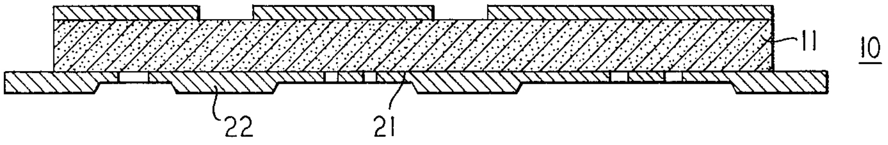
Figure 1E:
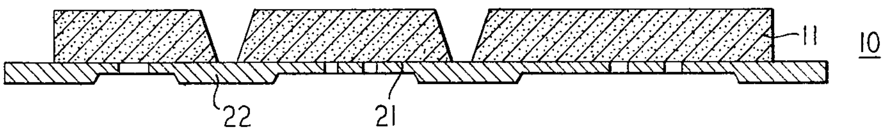

The view of FIG. 1D indicates the mask pattern as formed in the zirconium metal film preliminary to the anisotropic etching step. An etchant such as a solution of potassium hydroxide, n-propanol, and water, in accordance with the above-noted Kragness-Waggener disclosure, is applied to the zirconium masked surface 11. This treatment results in the removal of exposed silicon semiconductor material to produce the air-isolated wafer arrangement shown in FIG. 1E. During this process, which may require a period of an hour or more for the penetration of several mils thickness of silicon, there is virtually no erosion of the zirconium mask. Following the completion of the anisotropic etching process the unwanted zirconium may be removed readily using the above-noted mild acidic etchant to which the semiconductor structure is resistant.

Inasmuch as the etch resistance of the zirconium mask is a consequence of the inherent formation of a thin (15 to 40 A.) film of oxide on the metal surface, an alternative procedure of purposely anodizing the metal film may be used.

For example, instead of a positive photoresist pattern a negative pattern may be formed. The exposed zirconium then is anodized using an electrolytic process to build up a heavy zirconium oxide film of several hundred or more angstroms thickness. The photoresist is then stripped and the underlying zirconium removed using the weak nitric-hydrofluoric solution.

Although the invention has been described in terms of silicon semiconductor material, it is equally applicable to other commonly used semiconductor materials including germanium and materials of the III–V compound group, such as gallium arsenide and gallium phosphide. Moreover, although the specific embodiment is directed to formation of an air-isolated integrated circuit, the zirconium mask in accordance with the invention is suitable for other anisotropic etching processes including wafer separation and EPIC techniques.

What is claimed is:

1. The process of shaping a semiconductor body by selective etching using an alkaline etchant comprising:

(a) cleaning the surface to be selectively etched, (b) forming on said surface a mask pattern composed of a thin film of zirconium and overlying zirconium oxide, and (c) exposing said masked surface to an etchant comprising a hot alkaline solution.

2. The method in accordance with claim 1 in which the mask pattern is formed using a photoresist masking and etching step.

3. The method in accordance with claim 1 in which the zirconium film is deposited by high energy means.

4. The method in accordance with claim 1 in which the anisotropic etchant is one selected from the group consisting of aqueous solutions of hydroxides of sodium, potassium, lithium, cesium and rubidium.

References Cited

UNITED STATES PATENTS

| | | | |
|---|---|---|---|
| 3,442,701 | 5/1969 | Lepselter | 117—217 |
| 3,454,835 | 7/1969 | Rosvold | 317—235 |
| 3,506,509 | 4/1970 | Kragness et al. | 156—17 |
| 3,560,280 | 2/1971 | Nishida | 156—17 |

OTHER REFERENCES

Falzullin et al. "Anodic Behavior of Zirconium in Alkaline Solutions" Scientific Reports Kazan State University (Uchi Zap Kazansk Gos. Univ. 124 (3) 40–7 (1964)) Russ. (Chem. Abs. vol. 64 (1966)) 4577.

Leach et al. "The Corrosion of Uranium, Zirconium and Some Alloys in Alkaline Solutions," pp. 781–787 Jour. Electro Chem. Soc. vol. III, No. 7 (July 1964).

ROBERT F. BURNETT, Primary Examiner
R. J. ROCHE, Assistant Examiner

U.S. Cl. X.R.

156—17; 252—79.5